(12) United States Patent
Tsutsumi et al.

(10) Patent No.: US 10,600,707 B2
(45) Date of Patent: Mar. 24, 2020

(54) FIBER-CONTAINING RESIN SUBSTRATE, ENCAPSULATED SEMICONDUCTOR DEVICES MOUNTING SUBSTRATE, ENCAPSULATED SEMICONDUCTOR DEVICES FORMING WAFER, ENCAPSULATED SEMICONDUCTOR DEVICES MOUNTING SHEET, SEMICONDUCTOR EQUIPMENT, AND METHOD FOR MANUFACTURING SEMICONDUCTOR EQUIPMENT

(71) Applicant: SHIN-ETSU CHEMICAL CO., LTD., Tokyo (JP)

(72) Inventors: Yoshihiro Tsutsumi, Annaka (JP); Shuichi Fujii, Maebashi (JP); Kenji Hagiwara, Annaka (JP); Shinsuke Yamaguchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/040,850

(22) Filed: Jul. 20, 2018

(65) Prior Publication Data

US 2019/0067147 A1  Feb. 28, 2019

(30) Foreign Application Priority Data

Aug. 28, 2017 (JP) ................. 2017-163784

(51) Int. Cl.
*H01L 23/31* (2006.01)
*H01L 21/56* (2006.01)
*H01L 21/78* (2006.01)
*H01L 23/29* (2006.01)
(Continued)

(52) U.S. Cl.
CPC ........ *H01L 23/3135* (2013.01); *B29C 70/681* (2013.01); *C08G 59/245* (2013.01);
(Continued)

(58) Field of Classification Search
CPC .................................................. H01L 23/3135
See application file for complete search history.

(56) References Cited

U.S. PATENT DOCUMENTS

| 4,720,515 A | * | 1/1988 | Iji | ........................... C08L 63/00 523/400 |
| 5,298,548 A | * | 3/1994 | Shiobara | ............ C08G 59/3218 257/787 |

(Continued)

FOREIGN PATENT DOCUMENTS

| JP | H08-073621 A | 3/1996 |
| JP | 2006-216899 A | 8/2006 |
| JP | 2007-001266 A | 1/2007 |
| JP | 2009-060146 A | 3/2009 |
| JP | 2012-151451 A | 8/2012 |

*Primary Examiner* — Thao P Le
(74) *Attorney, Agent, or Firm* — Oliff PLC (57) ABSTRACT

A fiber-containing resin substrate includes a thermosetting epoxy resin-impregnated fiber base material, and an uncured resin layer formed on one side thereof formed from a composition containing: (A) a crystalline bisphenol A type epoxy resin and/or a crystalline bisphenol F type epoxy resin, (B) an epoxy resin that is non-fluid at 25° C. other than the component (A), (C) a phenol compound having two or more phenolic hydroxy groups in one molecule, (D) an inorganic filler, and (E) an urea-based curing accelerator. The fiber-containing resin substrate collectively encapsulates a semiconductor devices mounting surface or a semiconductor devices forming surface on a wafer level, even when a large-diameter wafer or a large-diameter substrate is encapsulated, to reduce warpage of the substrate or the wafer and peeling of a semiconductor device from the substrate, and to have the uncured resin layer excellent in storage stability and handleability before curing.

20 Claims, 3 Drawing Sheets

(51) Int. Cl.
  *B29C 70/68* (2006.01)
  *C08L 63/00* (2006.01)
  *C08G 59/62* (2006.01)
  *C08G 59/40* (2006.01)
  *C08G 59/24* (2006.01)
  *B29L 31/34* (2006.01)
  *B29C 70/70* (2006.01)
  *B29K 63/00* (2006.01)
  *B29C 70/08* (2006.01)

(52) U.S. Cl.
  CPC ....... *C08G 59/4021* (2013.01); *C08G 59/621* (2013.01); *C08L 63/00* (2013.01); *H01L 21/565* (2013.01); *H01L 21/78* (2013.01); *H01L 23/293* (2013.01); *B29C 70/086* (2013.01); *B29C 70/70* (2013.01); *B29K 2063/00* (2013.01); *B29L 2031/3481* (2013.01); *C08L 2205/02* (2013.01); *H01L 21/561* (2013.01)

(56) References Cited

U.S. PATENT DOCUMENTS

| | | | | |
|---|---|---|---|---|
| 5,599,628 | A * | 2/1997 | Gardner | C08G 59/24 428/413 |
| 2005/0032961 | A1 * | 2/2005 | Oguni | C08F 8/00 524/442 |
| 2009/0321117 | A1 * | 12/2009 | Valette | C08G 59/621 174/258 |
| 2012/0161339 | A1 | 6/2012 | Sekiguchi et al. | |
| 2017/0330813 | A1 * | 11/2017 | Nakamura | H01L 23/3114 |

* cited by examiner

FIBER-CONTAINING RESIN SUBSTRATE, ENCAPSULATED SEMICONDUCTOR DEVICES MOUNTING SUBSTRATE, ENCAPSULATED SEMICONDUCTOR DEVICES FORMING WAFER, ENCAPSULATED SEMICONDUCTOR DEVICES MOUNTING SHEET, SEMICONDUCTOR EQUIPMENT, AND METHOD FOR MANUFACTURING SEMICONDUCTOR EQUIPMENT

TECHNICAL FIELD

The present invention relates to a fiber-containing resin substrate for encapsulating a semiconductor, an encapsulated semiconductor devices mounting substrate, an encapsulated semiconductor devices forming wafer, an encapsulated semiconductor devices mounting sheet, a semiconductor equipment, and a method for manufacturing a semiconductor equipment.

BACKGROUND ART

In technologies of encapsulating a semiconductor, transfer molding previously has been the mainstream. The transfer molding, in which resin flowing occurs, involves various problems such as a limit on the package size, adverse influences of thinner and denser package size on chips and wires, warpage of package due to inhomogeneous distribution of fillers in molding, and inefficient use of resin due to the necessity of cull and runner. Based on these backgrounds, application of compression molding methods has been investigated, and various encapsulation materials in a sheet form also have been investigated not only in a liquid form (Patent Literatures 1, 2).

By the compression molding method, encapsulation can be performed without serious problems at present when a small-diameter wafer or a small-diameter substrate made of a metal and so on of approximately 200 mm (8 inches) is used, but there has been a serious problem that the substrate or the wafer warps due to shrinkage stress of an epoxy resin and the like at the time of the encapsulating and curing when encapsulating a large-diameter substrate having semiconductor devices mounted thereon or a large-diameter wafer having semiconductor devices formed thereon with a size of 300 mm (12 inches) or above. Furthermore, when encapsulating a semiconductor devices mounting surface of the large-diameter substrate having the semiconductor devices mounted thereon on a wafer level, there arises a problem that the semiconductor devices peel away from the substrate of a metal and the like due to the shrinkage stress of the epoxy resin and so on at the time of the encapsulating and curing, and that the next operation cannot be performed to cause a serious problem that mass production is impossible.

A method for solving the problems involved by an increase in diameter of the substrate having the semiconductor devices mounted thereon or the wafer having the semiconductor devices formed thereon as described above is to fill an encapsulating resin composition with nearly 90 wt % of a filler or reduce the shrinkage stress at the time of curing based on reduction of the elasticity of the encapsulating resin composition (Patent Literatures 3, 4, 5).

However, there newly arises a problem that, when filling with nearly 90 wt % of the filler, viscosity of the encapsulating resin composition increases, and the encapsulating resin composition applies force to the semiconductor devices mounted on the substrate at the time of casting, molding, and encapsulating, whereby the semiconductor devices peels away from the substrate, which is the same problem as in the transfer molding. Moreover, when the elasticity of the cured material of the encapsulating resin is lowered, the warp of the encapsulated substrate having the semiconductor devices mounted thereon or the encapsulated wafer having the semiconductor devices formed thereon can be improved, but a reduction in encapsulating performance such as heat resistance or moisture resistance newly occurs. Therefore, these methods cannot solve the problem fundamentally.

Accordingly, there has been demanded an encapsulant which can collectively encapsulate a semiconductor devices mounting surface of a substrate having the semiconductor devices mounted thereon or a semiconductor devices forming surface of a wafer having semiconductor devices formed thereon on a wafer level without causing warpage of the substrate or the wafer or peeling of the semiconductor devices from the substrate made of a metal and so on even though the large-diameter wafer or large-diameter substrate made of a metal and the like is encapsulated to attain excellent encapsulating performance such as heat resistance or moisture resistance after the encapsulation.

To solve these problems, a covering methods has been reported in which a semiconductor devices mounting surface of a substrate having the semiconductor devices mounted thereon or a semiconductor devices forming surface of a wafer having semiconductor devices formed thereon is covered with a fiber substrate impregnated with a thermosetting resin in which the fiber substrate is impregnated with the thermosetting resin and the thermosetting resin is fully cured, together with an uncured thermosetting resin composition formed on one surface of the fiber substrate impregnated with a thermosetting resin. This method reduces the warpage after molding by making the expansion coefficients of the fiber substrate and the semiconductor devices mounting substrate closer. Actually, it is very difficult to mount an uncured thermosetting resin composition onto a fiber base material, and is hard to attain handleability after the mounting.

CITATION LIST

Patent Literature

PATENT LITERATURE 1: Japanese Patent Laid-Open Publication No. H08-073621
PATENT LITERATURE 2: Japanese Patent Laid-Open Publication No. 2006-216899
PATENT LITERATURE 3: Japanese Patent Laid-Open Publication No. 2009-060146
PATENT LITERATURE 4: Japanese Patent Laid-Open Publication No. 2007-001266
PATENT LITERATURE 5: Japanese Patent Laid-Open Publication. No. 2012-151451

SUMMARY OF THE INVENTION

Technical Problem

The present invention was accomplished to solve the above problems. It is an object of the present invention to provide a fiber-containing resin substrate that makes it possible to collectively encapsulate a semiconductor devices mounting surface of the substrate having semiconductor devices mounted thereon or a semiconductor devices forming surface of the wafer having semiconductor devices formed thereon on a wafer level, even when a large-diameter wafer or a large-diameter substrate made of a metal and so on is encapsulated, to reduce warpage of the substrate or the wafer and peeling of a semiconductor device from the substrate, and to have the uncured resin layer excellent in storage stability and handleability before curing. It is another object of the present invention to provide an encapsulated semiconductor devices mounting substrate, an encapsulated semiconductor devices forming wafer, and an encapsulated semiconductor devices mounting sheet, each encapsulated with the fiber-containing resin substrate; a semiconductor equipment in which the encapsulated semiconductor devices mounting substrate, the encapsulated semiconductor devices forming wafer, or the encapsulated semiconductor devices mounting sheet is diced into each piece; as well as a method for manufacturing a semiconductor equipment using the fiber-containing resin substrate of the present invention.

Solution to Problem

To accomplish the object, the present invention provides a fiber-containing resin substrate for collectively encapsulating a semiconductor devices mounting surface of a substrate or a sheet on which two or more semiconductor devices are mounted or a semiconductor devices forming surface of a wafer on which semiconductor devices are formed, comprising:

a thermosetting epoxy resin-impregnated fiber base material composed of a fiber base material impregnated with a thermosetting epoxy resin that is semi-cured or cured, and an uncured resin layer formed on one side of the thermosetting epoxy resin-impregnated fiber base material for coating the semiconductor devices mounting surface or the semiconductor devices forming surface, wherein the uncured resin layer is a layer formed from a composition containing:

(A) a crystalline bisphenol A type epoxy resin and/or a crystalline bisphenol F type epoxy resin, (B) an epoxy resin that is non-fluid at 25° C. other than the component (A), (C) a phenol compound having two or more phenolic hydroxy groups in a molecule thereof, (D) an inorganic filler, and (E) an urea-based curing accelerator.

The fiber-containing resin substrate like this makes it possible to collectively encapsulate a semiconductor devices mounting surface of the substrate having semiconductor devices mounted thereon or a semiconductor devices forming surface of the wafer having semiconductor devices formed thereon on a wafer level, even when a large-diameter wafer or a large-diameter substrate made of a metal and so on is encapsulated, to reduce warpage of the substrate or the wafer and peeling of a semiconductor device from the substrate, and to have the uncured resin layer excellent in storage stability and handleability before curing.

It is preferable that the component (A) be contained in an amount of 10 to 25 parts by mass relative to 100 parts by mass of the total amount of the components (A), (B), and (C); and the component (E) be contained in an amount of 0.05 to 6 parts by mass relative to 100 parts by mass of the total amount of the components (A), (B), and (C).

The component (A) contained in the amount like this brings the uncured resin layer sufficient flexibility without causing risks of increasing of tackiness, lowering of ability for holding the uncured resin layer, and excess lowering of the glass transition temperature of a resin composing the uncured resin layer. The component (E) contained in the amount like this eliminates risks that the cured material of the composition loses the balance between heat resistance and humidity resistance and that the curing rate at molding becomes extremely lower or higher.

It is preferable that the component (D) be contained in an amount of 80 to 93 parts by mass relative to 100 parts by mass of the composition.

The component (D) contained in the amount like this allows the uncured resin layer to have sufficient strength without causing risk of short shot due to increased viscosity or peeling in a semiconductor equipment due to the loss of flexibility.

It is preferable that the component (E) be shown by the following general formula (1), $$R^1NHCONR^2R^3 \tag{1}$$

wherein $R^1$ represents a hydrogen atom, an alkyl group having 1 to 18 carbon atoms, or an aryl group having 6 to 18 carbon atoms; and $R^2$ and $R^3$ each represent an alkyl group having 1 to 6 carbon atoms; with $R^1$ to $R^3$ being the same or different with each other.

The uncured resin layer is allowed to attain the storage stability and the curability in better balance by containing the component (E) like this.

The present invention also provides an encapsulated semiconductor devices mounting substrate, comprising a semiconductor devices mounting surface of a substrate on which two or more semiconductor devices are mounted, the semiconductor devices mounting surface being collectively encapsulated with a cured material of the uncured resin layer of the fiber-containing resin substrate described above.

In the encapsulated semiconductor devices mounting substrate like this, warpage of the substrate and peeling of a semiconductor device from the substrate are reduced even when a semiconductor devices mounting substrate with a large diameter is collectively encapsulated.

The present invention also provides an encapsulated semiconductor devices forming wafer, comprising a semiconductor devices forming surface of a wafer on which two or more semiconductor devices are formed, the semiconductor devices forming surface being collectively encapsulated with a cured material of the uncured resin layer of the fiber-containing resin substrate described above.

In the encapsulated semiconductor devices forming wafer like this, warpage of the wafer is reduced even when a semiconductor devices forming wafer with a large diameter is collectively encapsulated.

The present invention also provides an encapsulated semiconductor devices mounting sheet, comprising a semiconductor devices mounting surface of a sheet on which two or more semiconductor devices are mounted, the semiconductor devices mounting surface being collectively encapsulated with a cured material of the uncured resin layer of the fiber-containing resin substrate described above.

In the encapsulated semiconductor devices mounting sheet like this, warpage of the sheet and peeling of a semiconductor device from the sheet are reduced even when a semiconductor devices mounting sheet with a large area is collectively encapsulated.

The present invention also provides a semiconductor equipment, wherein the encapsulated semiconductor devices mounting substrate, the encapsulated semiconductor devices forming wafer, or the encapsulated semiconductor devices mounting sheet described above is diced into each piece.

The semiconductor equipment like this is a high-quality semiconductor equipment in which the substrate, the wafer, or the sheet is free from warpage, being encapsulated with a fiber-containing resin substrate that is excellent in encapsulation properties such as heat resistance and humidity resistance, and peeling of a device from the substrate or the sheet is reduced.

The present invention also provides a method for manufacturing a semiconductor equipment, comprising the steps of:

covering the semiconductor devices mounting surface of a substrate or a sheet on which two or more semiconductor devices are mounted or the semiconductor devices forming surface of a wafer on which two or more semiconductor devices are formed with the uncured resin layer of the fiber-containing resin substrate described above;

collectively encapsulating the semiconductor devices mounting surface or the semiconductor devices forming surface by heating and curing the uncured resin layer to form an encapsulated semiconductor devices mounting substrate, an encapsulated semiconductor devices forming wafer, or an encapsulated semiconductor devices mounting sheet; and dicing the encapsulated semiconductor devices mounting substrate, the encapsulated semiconductor devices forming wafer, or the encapsulated semiconductor devices mounting sheet into each piece to manufacture the semiconductor equipment.

The method for manufacturing a semiconductor equipment like this makes it possible to manufacture a high-quality semiconductor equipment described above easily.

Advantageous Effects of Invention

As described above, the inventive fiber-containing resin substrate makes it possible to collectively encapsulate a semiconductor devices mounting surface of the substrate or the sheet having semiconductor devices mounted thereon or a semiconductor devices forming surface of the wafer having semiconductor devices formed thereon on a wafer level, even when a large-diameter wafer or a large-diameter substrate made of a metal and so on is encapsulated, to reduce warpage of the substrate or the wafer and peeling of a semiconductor device from the substrate, and to have the uncured resin layer excellent in storage stability and handleability before curing, particularly in crack resistance in handling of the uncured resin layer after forming. In the encapsulated semiconductor devices mounting substrate, the encapsulated semiconductor devices forming wafer, and the encapsulated semiconductor devices mounting sheet of the present invention, each encapsulated with the inventive fiber-containing resin substrate, the substrate, the wafer, or the sheet is free from warpage, and peeling of a semiconductor device from the substrate or the sheet is reduced. The inventive semiconductor equipment is a high-quality semiconductor equipment in which the substrate, the wafer, or the sheet is free from warpage, being encapsulated with a fiber-containing resin substrate that is excellent in encapsulation properties such as heat resistance and humidity resistance, and peeling of a device from the substrate or the sheet is reduced. Moreover, the inventive method for manufacturing a semiconductor equipment facilitates manufacturing of a high-quality semiconductor equipment described above.

DESCRIPTION OF EMBODIMENTS

As described above, it has been desired to develop a fiber-containing resin substrate that makes it possible to collectively encapsulate a semiconductor devices mounting surface of the substrate having semiconductor devices mounted thereon or a semiconductor devices forming surface of the wafer having semiconductor devices formed thereon on a wafer level, even when a large-diameter wafer or a large-diameter substrate made of a metal and so on is encapsulated, to reduce warpage of the substrate or the wafer and peeling of a semiconductor device from the substrate, and to have the uncured resin layer excellent in storage stability and handleability before curing.

The present inventors have diligently investigated to solve the above problems and found that the above problems can be solved with a fiber-containing resin substrate having an uncured resin layer formed from a composition that contains a particular combination of an epoxy resin and an urea-based curing accelerator; thereby bringing the present invention to completion.

That is, the present invention is a fiber-containing resin substrate for collectively encapsulating a semiconductor devices mounting surface of a substrate or a sheet on which two or more semiconductor devices are mounted or a semiconductor devices forming surface of a wafer on which semiconductor devices are formed, comprising:

a thermosetting epoxy resin-impregnated fiber base material composed of a fiber base material impregnated with a thermosetting epoxy resin that is semi-cured or cured, and an uncured resin layer formed on one side of the thermosetting epoxy resin-impregnated fiber base material for coating the semiconductor devices mounting surface or the semiconductor devices forming surface, wherein the uncured resin layer is a layer formed from a composition containing:

(A) a crystalline bisphenol A type epoxy resin and/or a crystalline bisphenol F type epoxy resin, (B) an epoxy resin that is non-fluid at 25° C. other than the component (A), (C) a phenol compound having two or more phenolic hydroxy groups in a molecule thereof, (D) an inorganic filler, and (E) an urea-based curing accelerator.

Hereinafter, the present invention will be specifically described regarding the fiber-containing resin substrate, the encapsulated semiconductor devices mounting substrate, the encapsulated semiconductor devices forming wafer, the encapsulated semiconductor devices mounting sheet, the semiconductor equipment, and the method for manufacturing a semiconductor equipment, but the present invention is not limited thereto.

<<Fiber-Containing Resin Substrate>>

Figure 1:
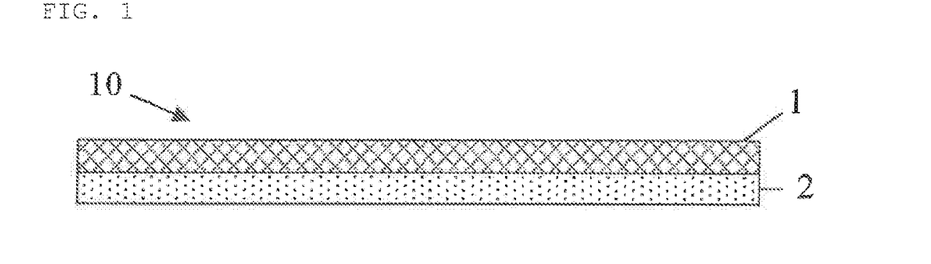
FIG. 1 is a sectional view of an example of the inventive fiber-containing resin substrate.

A sectional view of an example of the inventive fiber-containing resin substrate is shown in FIG. 1. The fiber-containing resin substrate 10 in FIG. 1 contains a thermosetting epoxy resin-impregnated fiber base material 1 and an uncured resin layer 2 formed on one side of the thermosetting epoxy resin-impregnated fiber base material 1.

[Thermosetting Epoxy Resin-Impregnated Fiber Base Material]

The inventive fiber-containing resin substrate contains a thermosetting epoxy resin-impregnated fiber base material. The thermosetting epoxy resin-impregnated fiber base material is a material in which a fiber base material is impregnated with a thermosetting epoxy resin, and the thermosetting epoxy resin is cured or semi-cured. The thermosetting epoxy resin-impregnated fiber base material can have a thermal expansion coefficient set to the thermal expansion coefficient of a semiconductor devices mounting substrate, a semiconductor devices forming wafer, or a semiconductor devices mounting sheet, thereby making it possible to reduce shrinkage stress when the uncured resin layer is cured, which will be described later. Accordingly, the thermosetting epoxy resin-impregnated fiber base material makes it possible to reduce warpage of the substrate, the wafer, or the sheet and peeling of a semiconductor device from the substrate or the sheet even when a large-diameter wafer, a large substrate made of a metal and so on, or a large-area sheet is encapsulated by the inventive fiber-containing resin substrate. The thermosetting epoxy resin-impregnated fiber base material also play the part to support the encapsulated formed material before and after dicing to improve the crack resistance of the encapsulating resin layer, that is, the uncured resin layer in handling.

<Fiber Base Material>

Illustrative examples of the fiber base material used for the present invention include substrates composed of inorganic fibers such as a carbon fiber, a glass fiber, a quartz glass fiber, and a metal fiber; organic fibers such as an aromatic polyamide fiber, a polyimide fiber, and a polyamideimide fiber; as well as a silicon carbide fiber, a titan carbide fiber, a boron fiber, and an alumina fiber. Any fiber base material can be used in accordance with product properties, but the fiber base material is preferably composed of a glass fiber, a quartz fiber, or a carbon fiber; and is more preferably composed of a glass fiber or a quartz glass fiber with higher insulation properties.

These fiber base materials can be in a form of a sheet-form such as roving obtained by pulling and aligning long fiber filaments in a certain direction, fiber cloth, and nonwoven cloth; as well as a chop strand mat, etc. It is preferable to be in a form that is capable of forming a laminate to adjust the thickness.

<Thermosetting Epoxy Resin>

The common thermosetting resin is exemplified by an epoxy resin, a silicone resin, and a mixed resin composed of an epoxy resin and a silicone resin. However, in view of compatibility with an encapsulating resin, that is, the resin of an uncured resin layer, a thermosetting epoxy resin is used for the present invention as a resin for impregnating the fiber base material. The thermosetting epoxy resin is not particularly limited and includes any resin that can be commonly used for encapsulating a semiconductor device.

<Method for Producing Thermosetting Epoxy Resin-Impregnated Fiber Base Material>

As the method for impregnating a fiber base material with a thermosetting epoxy resin, a solvent method and a hot melt method are exemplified, and each of which can be performed. The solvent method is a method in which a thermosetting epoxy resin is dissolved into an organic solvent to prepare a resin varnish, the resin varnish is impregnated to a fiber base material, and then the organic solvent is vaporized to be removed. The hot melt method is a method in which a solid thermosetting epoxy resin is heated to melt, and then impregnated to a fiber base material.

The method for curing or semi-curing the thermosetting epoxy resin impregnated to a fiber base material is not particularly limited, and is exemplified by a method in which the thermosetting epoxy resin impregnated to a fiber base material is heated to be cured or semi-cured, with the solvent being removed therefrom.

In the present invention, the semi-curing refers to the state of B-stage (an intermediate cured material of a thermosetting resin: in this state, the resin is softened by heating and is swelled by being in contact with some kinds of solvent, but is not totally melted or dissolved) as defined in JIS K 6800:2006 "Glossary of Terms Used in Adhesives and Adhesion".

The thickness of the thermosetting epoxy resin-impregnated fiber base material is determined by the thickness of a fiber base material such as a fiber cloth to be used. The thicker thermosetting epoxy resin-impregnated fiber base material can be produced using larger number of fiber base materials such as fiber clothes and by laminating the same.

The thermosetting epoxy resin-impregnated fiber base material preferably has a thickness of 20 μm to 1 mm, more preferably 25 μm to 500 μm in either case of curing or semi-curing the thermosetting epoxy resin impregnated to a fiber base material. When the thickness is 20 μm or more, sufficient effect is obtained for correcting the warpage, and the uncured resin layer has a favorable crack resistance.

The thermosetting epoxy resin-impregnated fiber base material is important to reduce the warpage after collectively encapsulating a semiconductor devices mounting surface of a substrate or a sheet on which two or more semiconductor devices are mounted or a semiconductor devices forming surface of a wafer on which semiconductor devices are formed, and to reinforce the substrate, the wafer, or the sheet on which two or more semiconductor devices are arranged and adhered. Accordingly, it is desirable that the thermosetting epoxy resin-impregnated fiber base material be hard and rigid.

The thermal expansion coefficient in an X-Y direction of the thermosetting epoxy resin-impregnated fiber base material is not particularly limited, but is preferably a value close to the thermal expansion coefficient of the substrate, the water, or the sheet used therein, and is more preferably 3 ppm or less. When this is satisfied with the thermal expansion coefficient in an X-Y direction of the thermosetting epoxy resin-impregnated fiber base material, it is possible to reduce the expansion and shrinkage of the uncured resin layer, that is, the encapsulating layer, and to reduce the warpage. Incidentally, the X-Y direction refers to a plane direction of the thermosetting epoxy resin-impregnated fiber base material. Additionally, the thermal expansion coefficient in an X-Y direction refers to a thermal expansion coefficient measured by arbitrarily setting an X axis and a Y axis in the plane direction of the thermosetting epoxy resin-impregnated fiber base material.

[Uncured Resin Layer]

The inventive fiber-containing resin substrate contains an uncured resin layer. The uncured resin layer is formed on one side of the thermosetting epoxy resin-impregnated fiber base material to cover a semiconductor device(s).

The uncured resin layer is formed using a composition that contains components (A) to (E) described below (a composition for forming an uncured resin layer) in view of handleability and adhesive properties to the thermosetting epoxy resin-impregnated fiber base material. Hereinafter, each component used for the composition for forming an uncured resin layer is described more specifically.

<Component (A)>

The component (A) used for the composition for forming an uncured resin layer in the present invention is a crystalline bisphenol A type epoxy resin and/or a crystalline bisphenol F type epoxy resin. The use of the component (A) like this enables the composition to form a sheet with flexibility when it is formed into a sheet-form by such a method as described below to form an uncured resin layer. The component (A) also can bring favorable adhesion properties with the thermosetting epoxy resin-impregnated fiber base material to have favorable encapsulation forming properties even when an inorganic filler, which is the component (D) described later, is highly loaded. The component (A) can be used regardless of the molecular weight and so on, but is preferably a bisphenol A type epoxy resin.

As the component (A), commercially available articles such as YL-6810 (manufactured by Mitsubishi Chemical Corporation), YSLV-70XY and YSLV-80XY (both manufactured by NIPPON STEEL & SUMIKIN CHEMICAL CO., LTD.) are usable.

The content of the component (A) is preferably 10 to 25 parts by mass, more preferably 12 to 22 parts by mass, and still more preferably 14 to 20 parts by mass relative to 100 parts by mass of the total amount of the component (A), an epoxy resin that is non-fluid at 25° C. other than the component (A), which is the component (B), and a phenol compound having two or more phenolic hydroxy groups in a molecule thereof, which is the component (C). When the composition is formed into sheet-form with the content being 10 parts by mass or more, the composition is allowed to give sufficient flexibility to the sheet. When the content is 25 parts by mass or less, the sheet is prevented from having excess tackiness, lowering of ability for holding the sheet, and excess lowering of the glass transition temperature of a resin composing the sheet, while keeping the sufficient flexibility.

<Component (B)>

The component (B) used for the composition for forming an uncured resin layer in the present invention is an epoxy resin that is non-fluid at 25° C. other than the component (A). In forming the composition into a sheet-form, the use of an epoxy resin that is fluidal at 25° C. gives a sheet that lacks in handleability such that the tackiness and adhesiveness are large, and the sheet is difficult to delaminate from a release film. Accordingly, an epoxy resin that is non-fluid at 25° C. is used in the present invention.

Illustrative examples of the epoxy resin of the component (B) includes common bisphenol A type epoxy resins and bisphenol F type epoxy resins that are solid; biphenol type epoxy resins such as 3,3',5,5'-tetramethyl-4,4'-biphenol type epoxy resins and 4,4'-biphenol type epoxy resins; phenol novolak type epoxy resins, cresol novolak type epoxy resins, bisphenol A novolak type epoxy resins, naphthalenediol type epoxy resins, trisphenylolmethane type epoxy resins, tetrakisphenylolethane type epoxy resins, and phenoldicyclopentadiene novolak type epoxy resins, the aromatic ring(s) or which is hydrogenated; alicyclic epoxy resins, and triazine derivative epoxy resins. Among them, the epoxy resin preferably has a softening point of 50 to 120° C. in view of improving the handleability of a sheet such as tackiness when the composition is formed into a sheet-form.

<Component (C)>

The component (C) used for the composition for forming an uncured resin layer in the present invention is a phenol compound having two or more phenolic hydroxy groups in one molecule. This component (C) is used as a curing agent for the component (A) and the component (B), and any commonly known ones can be used as long as having two or more, preferably three or more phenolic hydroxy groups in one molecule. Illustrative examples of the component (C) like this includes phenol novolak resins, cresol novolak resins, phenolaralkyl resins, naphtholaralkyl resins, terpene-modified phenolic resins, and dicyclopentadiene-modified phenolic resins. They can be used as a single substance or a mixture of two or more kinds. Any of these phenolic resins can be used regardless of the molecular weight, the softening point, and the amount of hydroxy groups, but preferably has a low softening point and relatively low viscosity.

The content of the component (C) is preferably an amount by which the equivalent ratio of phenolic hydroxy group in the component (C) is 0.5 to 2.0, more preferably 0.7 to 1.5 relative to the epoxy groups in the component (A) and the component (B). When the amount is 0.5 or more and 2.0 or less in equivalent ratio, the uncured resin layer is prevented from the risks of lowering the curability, mechanical properties, and humidity resistance.

<Component (D)>

The component (D) used for the composition for forming an uncured resin layer in the present invention is an inorganic filler. This component (D) is loaded to increase the strength of a cured material of the uncured resin layer. As the component (D) like this, it is possible to use any filler conventionally loaded to an epoxy resin composition or a silicone resin composition, including silicas such as a spherical silica, a fused silica, and a crystalline silica; alumina, silicon nitride, aluminum nitride, boron nitride, glass fibers, and glass particles, but silicas are preferable.

The average particle size and the shape of the component (D) are not particularly limited. The average particle size is, however, preferably 0.5 to 40 μm, more preferably 3 to 40 μm. As the component (D), a spherical silica with the average particle size of 0.5 to 40 μm is preferably used. Incidentally, the average particle size in the present invention is a value determined as a mass average particle size $D_{50}$ (or median diameter) in particle size distribution measurement using laser diffractometry.

In view of increasing the fluidity of the composition for forming an uncured resin layer, it is possible to use a combination of inorganic fillers with different particle size ranges as the component (D). In this case, it is preferable to use the combination of spherical silicas a fine particle size range of 0.1 to 3 μm, in a middle particle size range of 3 to 7 μm, and in a coarse particle size range of 10 to 40 μm. For further increasing the fluidity, it is preferable to use a spherical silica having still larger average particle size.

On the other hand, the inventive fiber-containing resin substrate is mainly intended to be formed by compression molding and laminate molding. In these molding methods, mold underfill (MUF) property has been increasingly demanded. In view of improving the MUF property, it is preferable to use a spherical silica with the average particle size of 0.5 to 6 μm and the top cut size of 5 to 20 μm.

Additionally, the component (D) may be previously subjected to surface treatment with a coupling agent, which is the component (I) described later, to increase the bonding strength thereof to the resin components (A), (B), and (C). The coupling agent may be a silane coupling agent, a titanate coupling agent, etc.

The content of the component (D) is preferably 400 to 1,300 parts by mass, particularly 500 to 1,200 parts by mass relative to 100 parts by mass of the total amount of the components (A), (B), and (C). When the content is 400 parts by mass or more, the uncured resin layer is allowed to have sufficient strength. When the content is 1,300 parts by mass or less, the uncured resin layer is prevented from the risks of causing short shot due to thickness increase and peeling in a semiconductor equipment due to the loss of flexibility. It is to be noted that the content of the component (D) is preferably 80 to 93 parts by mass, more preferably 83 to 92 parts by mass relative to 100 parts by mass of the composition. When the content is 80 parts by mass or more, the uncured resin layer is allowed to have sufficient strength. When the content is 93 parts by mass or less, the uncured resin layer is prevented from the risks of causing failures such as short shot due to thickness increase and peeling in a semiconductor equipment due to the loss of flexibility.

<Component (E)>

The component (E) used for the composition for forming an uncured resin layer in the present invention is an urea-based curing accelerator. This component (E) is blended to accelerate the curing reaction of the epoxy resins of the components (A) and (B) and the curing agent of the component (C). The use of the component (E) like this enables the uncured resin layer to be firmly cured in encapsulation forming not to be uncured while improving the storage stability. That is, the component (E) makes it possible to attain excellent formability.

The component (E) is preferably the one shown by the following general formula (1), $$R^1NHCONR^2R^3 \quad (1)$$

wherein $R^1$ represents a hydrogen atom, an alkyl group having 1 to 18 carbon atoms, or an aryl group having 6 to 18 carbon atoms; and $R^2$ and $R^3$ each represent an alkyl group having 1 to 6 carbon atoms; with $R^1$ to $R^3$ being the same or different with each other.

In the formula, $R^1$ represents a hydrogen atom, an alkyl group having 1 to 18 carbon atoms, or an aryl group having 6 to 18 carbon atoms; and $R^2$ and $R^3$ each represent an alkyl group having 1 to 6 carbon atoms; with $R^1$ to $R^3$ being the same or different with each other. As $R^1$, a cyclohexyl group is preferable in view of storage stability. As $R^2$ and $R^3$, a methyl group is preferable in view of storage stability and curability.

Illustrative examples of the urea-based curing accelerator shown by the general formula (1) include 1,1-dimethylurea, 1,1,3-trimethylurea, 1,1-dimethyl-3-ethylurea, 1,1-dimethyl-3-phenylurea, 1,1-diethyl-3-methylurea, 1,1-diethyl-3-phenylurea, 1,1-dimethyl-3-(3,4-dimethylphenyl)urea, 1,1-dimethyl-3-(p-chlorophenyl)urea, and 3-(3,4-dichlorophenyl)-1,1-dimethylurea (DCMU).

The content of the component (E) is preferably 0.05 to 6 parts by mass, particularly 0.1 to 5 parts by mass relative to 100 parts by mass of the total amount of the components (A), (B), and (C). When the content is 0.05 to 6 parts by mass, the uncured resin layer is prevented from the risk that the cured material upsets the balance between the heat resistance and the humidity resistance or that the curing rate in forming becomes extremely late or extremely fast.

In the composition for forming an uncured resin layer, the following optional component(s) can be blended in addition to the components (A) to (E).

<Component (F)>

In the composition for forming an uncured resin layer, a curing accelerator other than the component (E) (i.e., other than the urea-based curing accelerator) can be blended as a component (F) in addition to the component (E) described above. As the component (F) like this, any caring accelerator conventionally used for an epoxy resin can be used, including amine compounds such as 1,8-diazabicyclo[5.4.0]undec-7-ene; organic phosphorus compounds such as triphenyl phosphine and tetraphenylphosphonium tetraborate salt; and imidazole compounds such as 2-methylimidazole.

<Component (G)>

In the composition for forming an uncured resin layer, a releasing agent can be blended as a component (G). This component (G) is blended to improve the releasability in forming. In the present invention, however, this is blended to prevent unnecessary curing of the resin due to overload in a production by melt blending. Illustrative examples of the component (G) like this include natural waxes such as carnauba wax and rice wax; and synthetic waxes such as acid wax, polyethylene wax, and fatty acid ester, preferably carnauba wax in view of the elution properties from the resin.

The content of the component (G) is preferably 0.05 to 5.0 parts by mass, particularly 0.4 to 3.0 parts by mass relative to 100 parts by mass of the total amount of the components (A), (B), and (C). When the content is 0.05 parts by mass or more, the composition is prevented from the risks of insufficient releasability and overload in melt blending in production thereof. When the content is 5.0 parts by mass or less, the composition is prevented from the risks of bleeding failure and adhesion failure.

<Component (H)>

In the composition for forming an uncured resin layer, a flame-retardant can be blended as a component (H). This component (H) is blended to improve the flame resistance of the uncured resin layer. As the component (H) like this, any known one can be used without being particularly limited, including phosphazene compounds, silicone compounds, zinc molybdate supported with talc, zinc molybdate supported with zinc oxide, aluminum hydroxide, magnesium hydroxide, molybdenum oxide, and antimony trioxide. They may be used alone or in a combination of two or more kinds.

The content of the component (H) is preferably 2 to 20 parts by mass, particularly 3 to 10 parts by mass relative to 100 parts by mass of the total amount of the components (A), (B), and (C).

<Component (I)>

In the composition for forming an uncured resin layer, a coupling agent such as a silane coupling agent and a titanate coupling agent can be blended as a component (I). This component (I) is blended to increase the bonding strength of the resin components of the components and (A), (B), and (C) with inorganic filler, which is the component (D), or to improve the adhesiveness to a silicon wafer or an organic substrate. Illustrative examples of the component (I) like this include epoxy functional alkoxysilanes such as γ-glycidoxypropyltrimethoxysilane, γ-glycidoxypropylmethyldiethoxysilane, and β-(3,4-epoxycyclohexyl)ehtyltrimethoxysilane; mercapto functional alkoxysilanes such as γ-mercaptopropyltrimethoxysilane; amino functional alkoxysilanes such as γ-aminopropyltrimethoxysilane and N-2-(aminoethyl)-3-aminopropyltrimethoxysilane; and amino functional alkoxysilanes such as N-β-(aminoethyl)-γ-aminopropyltrimethoxysilane, γ-aminopropyltriethoxysilane, and N-phenyl-γ-aminopropyltrimethoxysilane.

The surface treatment may be performed by conventional way, and the method of surface treatment and the blending amount of the coupling agent used therein are not particularly limited. As described above, it is possible to treat the inorganic filler with the coupling agent previously, and it is also possible to perform surface treatment by adding the coupling agent while mixing the composition when the inorganic fillers of the component (D) is mixed with the resin components of the components (A), (B), and (C).

The content of the component (I) is preferably 0.1 to 8.0 parts by mass, particularly 0.5 to 6.0 parts by mass relative to 100 parts by mass of the total amount of the components (A), (B), and (C). When the content is 0.1 parts by mass or more, the effect of adhesion to a substrate becomes sufficient. When the content is 8.0 parts by mass or less, the composition is prevented from extremely lowering of the viscosity to cause voids.

<Other Additives>

To the composition for forming an uncured resin, various additives can also be blended in accordance with needs. It is possible to add or blend an additive(s) such as organopolysiloxane, silicone oil, thermoplastic resin, thermoplastic elastomer, organic synthetic rubber, and light stabilizer to improve the properties of resin; an ion trapping agent to improve the electric properties; and pigments such as carbon black in view of coloring.

<<Method for Manufacturing the Fiber-Containing Resin Substrate>>

Regarding the method for manufacturing the inventive fiber-containing resin substrate, the fiber-containing resin substrate can be manufactured by the method in which a fiber base material is impregnated with a thermosetting epoxy resin, followed by curing or semi-curing the thermosetting epoxy resin to form a thermosetting epoxy resin-impregnated fiber base material; and a liquid composition for forming an uncured resin layer is applied to one side of the resin-impregnated fiber base material under reduced pressure or vacuum by printing or dispensing, followed by heating to form an uncured resin layer that is solid at 50° C. or less. Alternatively, the uncured resin layer can be formed by various methods that have been used for conventional thermosetting epoxy resins such as press molding or printing the composition for forming an uncured resin layer on one side of the thermosetting epoxy resin-impregnated fiber base material in which a fiber base material is impregnated with a thermosetting epoxy resin, and the thermosetting epoxy resin is cured. The formation of uncured resin layer is preferably followed by post-curing normally at a temperature of about 150 to 180° C. for 4 to 8 hours. The uncured resin layer can also be formed uniformly on one side of the thermosetting epoxy resin-impregnated fiber base material by a method to perform pressing while heating the composition for forming an uncured resin layer, which is solid at room temperature, or a method to liquefy the solid composition for forming an uncured resin layer by adding an appropriate amount of polar solvent such as acetone, followed by forming a thin film by printing, etc., and to remove the solvent by heating under reduced pressure, etc.

As the composition for forming an uncured resin layer that is solid at room temperature, it is preferable to use the one in which the composition is formed into a sheet-form. The method for producing this sheet includes a T-die extrusion method, in which epoxy resins of the components (A) and (B), a phenol compounds of the component (C), an inorganic filler of the component (D), an urea-based curing accelerator of the component (E), and other additives are blended in a prescribed composition ratio, and this is mixed sufficiently homogeneously with a mixer and so on, followed by sheet-forming using a twin-screw extruder in which a T-die is installed to the tip. Alternatively, the sheet-formed composition for forming an uncured resin layer can be obtained by sheet-forming in which melt mixing treatment is performed with a heat roll, a kneader, or an extruder, followed by cooling to solidify and grinding the mixture into appropriate size, and the obtained ground product of the composition is heated to 70 to 120° C. between pressure members, thereby being melted and compressed.

The sheet-formed composition for forming an uncured resin layer thus obtained preferably has a thickness of 0.1 to 5.0 mm.

As described above, the inventive fiber-containing resin substrate makes it possible to collectively encapsulate a semiconductor devices mounting surface of the substrate or the sheet having semiconductor devices mounted thereon or a semiconductor devices forming surface of the wafer having semiconductor devices formed thereon on a wafer level, even when a large-diameter wafer or a large-diameter substrate made of a metal and so on is encapsulated, to reduce warpage of the substrate or the wafer and peeling of a semiconductor device from the substrate, and to have the uncured resin layer excellent in storage stability and handleability before curing, particularly in crack resistance in handling of the uncured resin layer after forming.

<<Encapsulated Semiconductor Devices Mounting Substrate>>

The present invention provides an encapsulated semiconductor devices mounting substrate in which the semiconductor devices mounting surface of a substrate having two or more semiconductor devices mounted thereon is collectively encapsulated with the uncured resin layer of the fiber-containing resin substrate described above.

Figure 2:
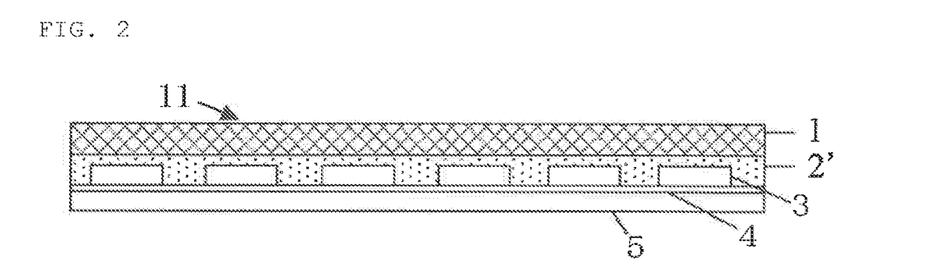
FIG. 2 is a sectional view of an example of the inventive encapsulated semiconductor devices mounting substrate.

The sectional view of an example of the inventive encapsulated semiconductor devices mounting substrate is shown in FIG. 2. In the encapsulated semiconductor devices mounting substrate 11 in FIG. 2, the semiconductor devices mounting surface of a substrate 5 having two or more semiconductor devices 3 mounted thereon is collectively encapsulated with a cured material of the uncured resin layer 2 (i.e., a cured resin layer 2') of the fiber-containing resin substrate 10 in FIG. 1.

In the encapsulated semiconductor devices mounting substrate like this, being collectively encapsulated with the inventive fiber-containing resin substrate, warpage of the substrate and peeling of a semiconductor device from the substrate are reduced.

[Semiconductor Devices Mounting Substrate]

One of the semiconductor devices mounting substrate is the substrate in FIG. 2 in which two or more semiconductor devices 3 are mounted on a substrate (e.g., inorganic, metallic, or organic substrate) with an adhesive 4. Incidentally, the semiconductor devices mounting substrate includes an array of semiconductor devices in which semiconductor devices are mounted and arranged.

<<Encapsulated Semiconductor Devices Forming Wafer>>

The present invention provides an encapsulated semiconductor devices forming wafer in which the semiconductor devices forming surface of a wafer having two or more semiconductor devices formed thereon is collectively encapsulated with the uncured resin layer of the fiber-containing resin substrate described above.

Figure 3:
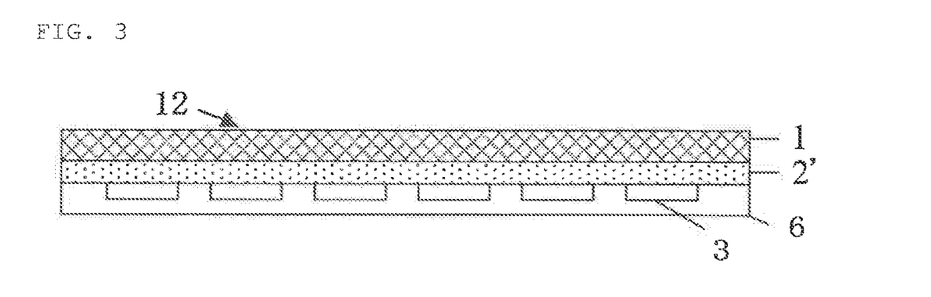
FIG. 3 is a sectional view of an example of the inventive encapsulated semiconductor devices forming wafer.

The sectional view of an example of the inventive encapsulated semiconductor devices forming wafer is shown in FIG. 3. In the encapsulated semiconductor devices forming wafer 12 in FIG. 3, the semiconductor devices forming surface of a wafer 6 having two or more semiconductor devices 3 mounted thereon is collectively encapsulated with a cured material of the uncured resin layer 2 (i.e., a cured resin layer 2') of the fiber-containing resin substrate 10 in FIG. 1.

In the encapsulated semiconductor devices forming wafer like this, being collectively encapsulated with the inventive fiber-containing resin substrate, warpage of the wafer is reduced.

<<Encapsulated Semiconductor Devices Mounting Sheet>>

The present invention provides an encapsulated semiconductor devices mounting sheet in which the semiconductor devices mounting surface of a sheet having two or more semiconductor devices mounted thereon is collectively encapsulated with the uncured resin layer of the fiber-containing resin substrate described above.

The sectional view of an example of the inventive encapsulated semiconductor devices mounting sheet is represented as the one in which a sheet is used instead of the substrate 5 of the encapsulated semiconductor devices mounting substrate 11 in FIG. 2.

In the encapsulated semiconductor devices mounting sheet like this, being collectively encapsulated with the inventive fiber-containing resin substrate, warpage of the sheet and peeling of a semiconductor device from the sheet are reduced.

<<Semiconductor Equipment>>

The present invention provides a semiconductor equipment that is a piece diced from the encapsulated semiconductor devices mounting substrate, the encapsulated semiconductor devices forming wafer, or the encapsulated semiconductor devices mounting sheet described above.

Figure 4:
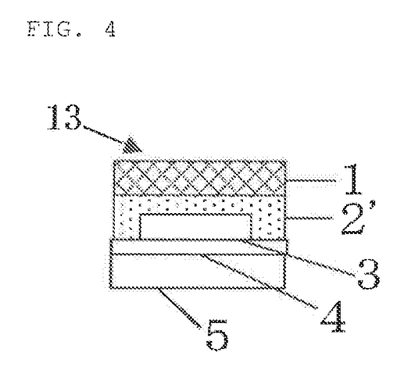
FIG. 4 is a sectional view of an example of the semiconductor equipment in which the inventive encapsulated semiconductor devices mounting substrate is diced into each piece.
Figure 5:
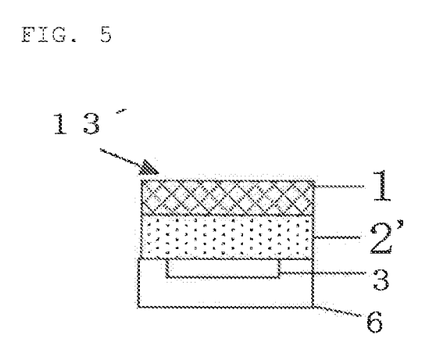
FIG. 5 is a sectional view of an example of the semiconductor equipment in which the inventive encapsulated semiconductor devices forming wafer is diced into each piece.

The sectional views of an example of the inventive semiconductor equipment are shown in FIGS. 4 and 5. The semiconductor equipment 13 in FIG. 4 is a piece diced from the encapsulated semiconductor devices mounting substrate 11 in FIG. 2. The semiconductor equipment 13' in FIG. 5 is a piece diced from the encapsulated semiconductor devices forming wafer 12 in FIG. 3. Each semiconductor equipment 13 and 13' thus formed is a high-quality semiconductor equipment in which the substrate, the wafer, or the sheet is free from warpage, being encapsulated with a fiber-containing resin substrate that is excellent in encapsulation properties such as heat resistance and humidity resistance, and peeling of a device from the substrate or the sheet is reduced. The semiconductor equipment 13 is a semiconductor equipment in which the semiconductor device 3 is mounted on the substrate 5 via the adhesive 4, and they are encapsulated with the cured resin layer 2' and the resin-impregnated fiber base material from thereon (FIG. 4). The semiconductor equipment 13' is a semiconductor equipment in which the semiconductor device 3 is formed on the wafer 6, and they are encapsulated with the cured resin layer 2' and the resin-impregnated fiber base material 1 from thereon (FIG. 5).

<<Method for Manufacturing a Semiconductor Equipment>>

The present invention also provides a method for manufacturing a semiconductor equipment, comprising the steps of: covering the semiconductor devices mounting surface of a substrate or a sheet on which two or more semiconductor devices are mounted or the semiconductor devices forming surface of a wafer on which two or more semiconductor devices are formed with the uncured resin layer of the fiber-containing resin substrate described above; collectively encapsulating the semiconductor devices mounting surface or the semiconductor devices forming surface by heating and curing the uncured resin layer to form an encapsulated semiconductor devices mounting substrate, an encapsulated semiconductor devices forming wafer, or an encapsulated semiconductor devices mounting sheet; and dicing the encapsulated semiconductor devices mounting substrate, the encapsulated semiconductor devices forming wafer, or the encapsulated semiconductor devices mounting sheet into each piece to manufacture the semiconductor equipment. Hereinafter, the inventive method for manufacturing a semiconductor equipment will be described using FIG. 6.

<Covering Step>

Figure 6:
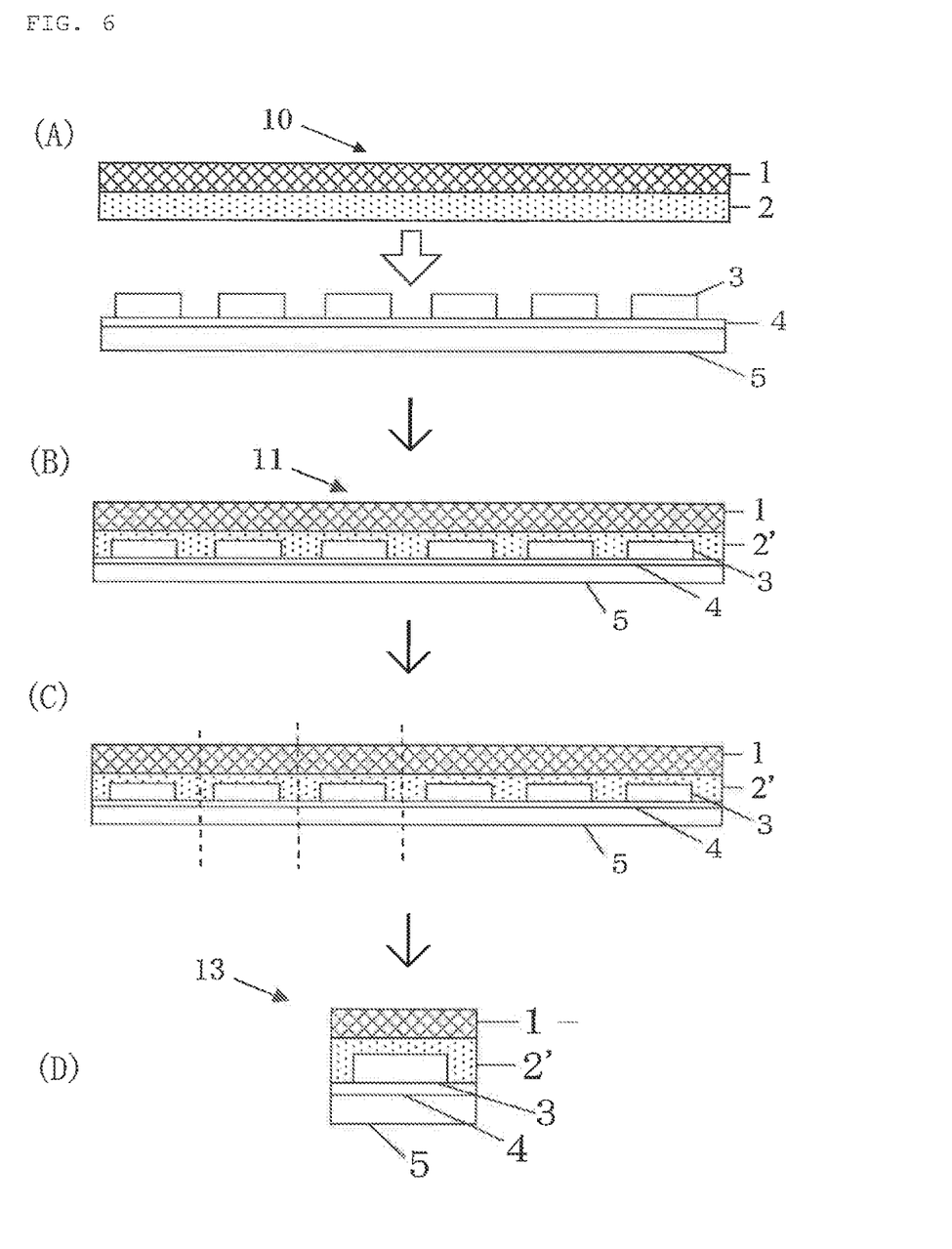
FIG. 6 is an explanatory drawing of an example of the inventive method for manufacturing a semiconductor equipment.

The covering step in the inventive method for manufacturing a semiconductor equipment is a step to cover the semiconductor devices mounting surface of the substrate 5, on which the semiconductor devices 3 are mounted via the adhesion 4, with the uncured resin layer 2 of the fiber-containing resin substrate 10, which contains the thermosetting epoxy resin-impregnated fiber base material 1 and the uncured resin layer 2 (FIG. 6(A)).

<Encapsulating Step>

The encapsulating step in the inventive method for manufacturing a semiconductor equipment is a step in which the uncured resin layer 2 of the fiber-containing resin substrate 10 is heated and cured to form the cured resin layer 2', thereby collectively encapsulating the semiconductor devices mounting surface of the substrate 5 having the semiconductor devices 3 mounted thereon to form the encapsulated semiconductor devices mounting substrate 11 (FIG. 6(B)).

<Dicing Step>

The dicing step in the inventive method for manufacturing a semiconductor equipment is a step to dice the encapsulated semiconductor devices mounting substrate 11 into each piece to manufacture the semiconductor equipment 13 (FIGS. 6(C) and (D)).

It is to be noted that this part describes the method for manufacturing a semiconductor equipment using a semiconductor devices mounting substrate, but the same method can be applied to the manufacturing of a semiconductor equipment using a semiconductor devices forming wafer or a semiconductor devices mounting sheet.

Hereinafter, the inventive method for manufacturing a semiconductor equipment will be described more specifically. The covering step and the encapsulating step described above can be performed without causing a void or warpage with a vacuum laminator apparatus, a vacuum press apparatus, etc. that are used for laminating a solder resist film, various kinds of insulator films, etc. As a method of lamination, any method can be adapted including roll lamination, diaphragm type vacuum lamination, and air-pressure lamination.

Here, description will be given as to an example of using the vacuum lamination apparatus manufactured by Nichigo-Morton Co., Ltd. to encapsulate a substrate in which a silicon chip having a size of 14×14 mm is mounted on an organic substrate having a thickness of 250 μm and a size of 60×220 mm with a fiber-containing resin substrate containing a thermosetting epoxy resin-impregnated fiber base material in which a glass cloth having a thickness of 42 μm (fiber base material) is impregnated with a thermosetting epoxy resin, together with an uncured resin layer having a thickness of 150 μm formed on one side thereof.

In upper and lower plates each having a built-in heater and set to 150° C., the upper plate has a diaphragm rubber appressed against the heater under reduced pressure. The organic substrate is set on the lower plate, the fiber-containing resin substrate is set on one side of this organic substrate so that the uncured resin layer surface faces to the semiconductor mounting surface of the organic substrate. Then, the lower plates is moved up, the upper and lower plates are closely attached to each other to form a vacuum chamber with an O-ring installed so as to surround the organic substrate set on the lower plate, and a pressure in the vacuum chamber is reduced. When the pressure in the vacuum chamber is sufficiently reduced, a valve of a pipe communicating with a vacuum ump from a space between the diaphragm rubber of the upper plate and the heater is closed, and compressed air is fed thereinto. As a result, the upper diaphragm rubber inflates to sandwich the organic substrate and the fiber-containing resin substrate between the upper diaphragm rubber and the lower plate, and vacuum lamination and curing of the thermosetting epoxy resin proceed simultaneously to complete the encapsulation. As the curing time, approximately 3 to 20 minutes is sufficient. When the vacuum lamination is completed, the pressure in the vacuum chamber is restored to ordinal pressure, the lower plate is moved down, and the encapsulated organic substrate is taken out. The above steps make it possible to encapsulate the substrate without causing a void or warpage. The taken-out substrate is allowed to have stabilized electrical properties and mechanical properties by post-curing at a temperature of 150 to 180° C. for 1 to 4 hours usually.

The method for manufacturing a semiconductor equipment like this makes it possible to cover a semiconductor devices mounting surface or a semiconductor devices forming surface more easily without causing short shot with the uncured resin layer of the fiber-containing resin substrate in the covering step. Using a fiber-containing resin substrate, the shrinkage stress of the uncured resin layer in curing can be reduced with the thermosetting epoxy resin-impregnated fiber base material, thereby making it possible to collectively encapsulate the semiconductor devices mounting surface or the semiconductor devices forming surface in the encapsulating step, and to obtain an encapsulated semiconductor devices mounting substrate or sheet or an encapsulated semiconductor devices forming wafer in which warpage of the substrate, wafer, or sheet and peeling of a semiconductor device from the substrate or sheet are reduced even when a thin large-diameter wafer or a large-diameter substrate made of a metal and so on is encapsulated. Additionally, the inventive method for manufacturing a semiconductor equipment makes it possible to manufacture a high-quality semiconductor equipment easily since the dicing step makes it possible to obtain a semiconductor equipment that has been diced into each pieces from an encapsulated semiconductor devices mounting substrate or sheet or an encapsulated semiconductor devices forming wafer encapsulated with a fiber-containing resin substrate that is excellent in encapsulation properties such as heat resistance and humidity resistance to have reduced warpage.

EXAMPLES

Hereinafter, the present invention will be specifically described by showing Examples and Comparative Examples, but the present invention is not limited to the following Examples.
<Production of Thermosetting Epoxy Resin-Impregnated Fiber Base Material>

To a mixture of 60 parts by mass of a cresol novolak type epoxy resin (trade name: EPICLON-N695, manufactured by DIC CORPORATION), 30 parts by mass of a phenol novolak resin (trade name: TD2090, manufactured by DIC CORPORATION), 150 parts by mass of a silica with a particle size of 0.5 μm (trade name: SO-25R, manufactured by Admatechs Co., Ltd.), 3 parts by mass of carbon black (trade name: 3230B, manufactured by Mitsubishi Chemical Corporation) as a black pigment, and 0.6 parts by mass of triphenyl phosphine (TPP, manufactured by HOKKO CHEMICAL INDUSTRY CO., LTD.), 300 parts by mass of toluene was added, and this was stirred and mixed to prepare a dispersion of epoxy resin composition in toluene. Into this dispersion of epoxy resin composition in toluene, a T-glass cloth (manufactured by Nitto Boseki Co., Ltd., thickness: 88 μm) was dipped as a fiber base material to impregnate the T-glass cloth with the dispersion of epoxy resin composition in toluene. This glass cloth was left at 120° C. for 15 minutes to evaporate the toluene. The glass cloth was subjected to heat molding at 175° C. for 5 minutes to give a molded article. This was additionally heated at 180° C. for 4 hours (secondary curing) to cure the impregnated epoxy resin composition to produce thermosetting epoxy resin-impregnated fiber base material X1 with a size of 400 mm×500 mm and a thickness of 0.12 mm in which cured material layers of the epoxy resin composition were formed on the both sides of the fiber base material layer. Then, this was cut into a disk-form with a diameter of 300 mm (12 inches). It was found that this thermosetting epoxy resin-impregnated fiber base material X1 had a coefficient of linear expansion from 0 to 200° C. of 5 to 8 ppm/° C.

The raw materials used in Examples and Comparative Examples are as follows.
(A) Crystalline bisphenol A type epoxy resin and/or crystalline bisphenol F type epoxy resin
(A-1): crystalline bisphenol A type epoxy resin (YL-6810: trade name, manufactured by Mitsubishi Chemical Corporation, epoxy equivalent: 170)
(B) Epoxy resin that is non-fluid at 25° C. other than the component (A)
(B-1): solid bisphenol A type epoxy resin (jER-1001: trade name, manufactured by Mitsubishi Chemical Corporation, epoxy equivalent: 475)
(B-2): cresol novolak type epoxy resin (EPICLON N-670: trade name, manufactured by DIC CORPORATION, epoxy equivalent: 210)
(B-3): biphenyl type epoxy resin (YX-4000: trade name, manufactured by Mitsubishi Chemical Corporation, epoxy equivalent: 186)
(B-4): trisphenolmethane type epoxy resin (EPPN-501: trade name, manufactured by Nippon Kayaku Co., Ltd., epoxy equivalent: 166)
(C) Phenol compound having two or more phenolic hydroxy groups in one molecule
(C-1): trisphenolmethane type phenolic resin (MEH-7500: trade name, manufactured by MEIWA PLASTIC INDUSTRIES, LTD., hydroxy equivalent: 97)
(C-2): phenol novolak type phenolic curing agent (TD-2131: trade name, manufactured by DIC CORPORATION, hydroxy equivalent: 110)
(D) Inorganic filler
(D-1): spherical fused silica (CS-6103 53C2: trade name, manufactured by TATSUMORI LTD., average particle size: 10 μm)
(E) Urea-based curing accelerator
(E-1): aromatic dimethylurea (U-CAT 3512T: trade name, manufactured by San-Apro Ltd.)
(E-2): aliphatic dimethylurea (U-CAT 3513N: trade name, manufactured by San-Apro Ltd.)

(F) Curing accelerator other than urea-based one
(F-1): 2-ethyl-4-methylimidazole (2E4MZ, manufactured by SHIKOKU CHEMICALS CORPORATION)
(F-2): triphenyl phosphine (TPP, HOKKO CHEMICAL INDUSTRY CO., LTD.)
(G) Releasing agent
(G-1): carnauba wax (TOWAX-131: trade name, manufactured by TOA KASEI CO., LTD.)
(H) Flame-retardant
(H-1): zinc molybdate supported with zinc oxide (KEM-GARD 911C: trade name, manufactured by Sherwin-Williams Company)
(I) Coupling agent
(I-1): silane coupling agent: 3-mercaptopropyltrimethoxysilane (KBM-803: trade name, manufactured by Shin-Etsu Chemical Co., Ltd.)
(J) Colorant
(J-1): carbon black (Mitsubishi carbon black #3230MJ: trade name, manufactured by Mitsubishi Chemical Corporation)

Examples 1 to 5, Comparative Examples 1 to 8

<Preparation of Composition for Forming Uncured Resin Layer>
In each of the formulations shown in Table 1 and Table 2, a composition was previously prepared by pre-mixing with a Henschel mixer. Then, each composition was formed to have a width of 400 mm and a thickness of 0.3 mm using a twin-screw extruder in which a T-die had been installed to give a composition for forming an uncured resin layer in a sheet-form. Subsequently, this was cut into a disk-form with a diameter of 280 mm.

<Production of Fiber-Containing Resin Substrate>
Each composition for forming an uncured resin layer in a sheet-form produced as described above was placed on the epoxy resin-impregnated fiber base material X1, and these were laminated using a vacuum laminator manufactured by Nikko-Materials Co., Ltd. under the conditions of a degree of vacuum of 50 Pa, a temperature of 100° C., and a period of 10 seconds to produce a fiber-containing resin substrate. In the production of each fiber-containing resin substrate by this sheet laminating, handleability was evaluated. The results are shown in Table 1 and Table 2.

TABLE 1

| | Formulation of composition | | Examples | | | | |
|---|---|---|---|---|---|---|---|
| | (parts by mass) | | 1 | 2 | 3 | 4 | 5 |
| (A) | Epoxy resin | A-1 | 10.0 | 17.8 | 17.8 | 15.4 | 14.1 |
| (B) | Epoxy resin other | B-1 | — | — | — | — | — |
| | than (A) | B-2 | 55.0 | 44.5 | 44.5 | — | 42.3 |
| | | B-3 | — | — | — | 46.1 | — |
| | | B-4 | — | — | — | — | — |
| (C) | Phenol compound | C-1 | 35.0 | 37.7 | 37.7 | 38.5 | — |
| | | C-2 | — | — | — | — | 43.6 |
| (D) | Inorganic filler | D-1 | 600.0 | 1200.0 | 1200.0 | 600.0 | 600.0 |
| (E) | Urea-based curing | E-1 | 2.0 | 2.0 | — | 2.0 | 2.0 |
| | accelerator | E-2 | — | — | 2.0 | — | — |
| (F) | Accelerator other | F-1 | — | — | — | — | — |
| | than urea-based one | F-2 | — | — | — | — | — |
| (G) | Releasing agent | G-1 | 1.0 | 1.0 | 1.0 | 1.0 | 1.0 |
| (H) | Flame-retardant | H-1 | 10.0 | 10.0 | 10.0 | 10.0 | 10.0 |
| (I) | Coupling agent | I-1 | 0.5 | 0.5 | 0.5 | 0.5 | 0.5 |
| (J) | Colorant | J-1 | 2.0 | 2.0 | 2.0 | 2.0 | 2.0 |
| | Handleability in producing fiber-containing resin substrate | | Successfully laminated without any problem | | | | |

TABLE 2

| | Formulation of composition | | Comparative Examples | | | | | | | |
|---|---|---|---|---|---|---|---|---|---|---|
| | (parts by mass) | | 1 | 2 | 3 | 4 | 5 | 6 | 7 | 8 |
| (A) | Epoxy resin | A-1 | 50.8 | 17.8 | 17.8 | 17.8 | — | — | — | — |
| (B) | Epoxy resin other | B-1 | — | — | — | — | 17.8 | — | — | — |
| | than (A) | B-2 | — | 44.5 | 44.5 | 44.5 | 44.5 | 50.9 | 50.3 | 48.1 |
| | | B-3 | — | — | — | — | — | 17.0 | — | — |
| | | B-4 | — | — | — | — | — | — | 16.7 | 16.0 |
| (C) | Phenol compound | C-1 | 40.2 | 37.7 | 37.7 | 37.7 | 37.7 | 32.1 | 33.0 | — |
| | | C-2 | — | — | — | — | — | — | — | 35.9 |
| (D) | Inorganic filler | D-1 | 600.0 | 600.0 | 600.0 | 600.0 | 600.0 | 600.0 | 600.0 | 60.0 |
| (E) | Urea-based curing | E-1 | 2.0 | — | — | — | 2.0 | 2.0 | 2.0 | 2.0 |
| | accelerator | E-2 | — | — | — | — | — | — | — | — |
| (F) | Accelerator other | F-1 | — | 1.0 | — | — | — | — | — | — |
| | than urea-based one | F-2 | — | — | 2.0 | 0.5 | — | — | — | — |
| (G) | Releasing agent | G-1 | 1.0 | 1.0 | 1.0 | 1.0 | 1.0 | 1.0 | 1.0 | 1.0 |
| (H) | Flame-retardant | H-1 | 10.0 | 10.0 | 10.0 | 10.0 | 10.0 | 10.0 | 10.0 | 10.0 |
| (I) | Coupling agent | I-1 | 0.5 | 0.5 | 0.5 | 0.5 | 0.5 | 0.5 | 0.5 | 0.5 |
| (J) | Colorant | J-1 | 2.0 | 2.0 | 2.0 | 2.0 | 2.0 | 2.0 | 2.0 | 2.0 |

TABLE 2-continued

| Formulation of composition (parts by mass) | Comparative Examples | | | | | | | |
|---|---|---|---|---|---|---|---|---|
| | 1 | 2 | 3 | 4 | 5 | 6 | 7 | 8 |
| Handleability in producing fiber-containing resin substrate | Strong tackiness Hard to handle the sheet | Successfuly laminated without any problem | | | Sheet breakage occurred before laminating the sheet Uncured resin layer readily caused crack and peeling from the substrate after laminating | | | |

Examples 6 to 10, Comparative Examples 9 to 12

<Production of Semiconductor Devices Mounting Substrate>

On a silicon wafer with a diameter of 300 mm (12 inches) and a thickness of 300 μm, 400 silicon chips with a size of 10 mm×10 mm and a thickness of 200 μm were arranged and mounted using adhesive (trade name: SFX-513S, manufactured by Shin-Etsu Chemical Co., Ltd.)

<Covering and Encapsulating of Semiconductor Devices Mounting Wafer>

Subsequently, the substrates described above were covered and encapsulated using a vacuum lamination apparatus manufactured by Nichigo-Morton Co., Ltd., setting the plate temperature to 150° C. First, the semiconductor devices mounting surface of the silicon wafer was brought into contact with each fiber-containing resin substrate produced as described above and was covered therewith. Then, this was subjected to vacuum compression molding for 5 minutes with the plates being closed to perform curing and encapsulating. After the curing and encapsulating, post-curing was performed at 150° C. for 4 hours to give an encapsulated semiconductor devices mounting substrate. At this time, the substrate was encapsulated using only the fiber-containing resin substrates that had been able to laminate without any problem in the results of handleability evaluated in producing a fiber-containing resin substrate shown in Table 1 and Table 2.

Each encapsulated semiconductor devices mounting substrate thus encapsulated was evaluated for the warpage, appearance, and the state of adhesion between the resin and the substrate. The results are shown in Table 3 and Table 4. The appearance was evaluated by examining the existence and non-existence of unfilled area (void) and die mark, and was determined as good when they were not detected. The state of adhesion was determined as good when peeling was not detected in the molding.

TABLE 3

| Evaluation results after encapsulation | Examples | | | | |
|---|---|---|---|---|---|
| | 6 | 7 | 8 | 9 | 10 |
| Composition used | Example 1 | Example 2 | Example 3 | Example 4 | Example 5 |
| Appearance   Filling properties | good | good | good | good | good |
| Die mark | none | none | none | none | none |
| Warpage of substrate (mm) | 0.3 | 0.3 | 0.4 | 0.6 | 0.2 |
| State of adhesion | good | good | good | good | good |
| Remarks | — | — | — | — | — |

TABLE 4

| Evaluation results after encapsulation | Comparative Examples | | | |
|---|---|---|---|---|
| | 9 | 10 | 11 | 12 |
| Composition used | Comparative Example 2 | Comparative Example 3 | Comparative Example 4 | Example 1 |
| Appearance   Filling properties | unfilled | unfilled | uncured | good |
| Die mark | none | none | | detected |
| Warpage of substrate (mm) | 0.5 | 0.6 | | 4.5 |
| State of adhesion | good | good | | good |
| Remarks | — | — | | Without using fiber-containing resin substrate |

As shown in Table 1, Examples 1 to 5, in which each uncured resin layer of a fiber-containing resin substrate was formed from a composition containing components (A) to (E), gave an uncured resin layer with good handleability when the sheets were laminated in producing the fiber-containing resin substrate. As shown in Table 3, the inventive fiber-containing resin substrates, using these uncured resin layers, was excellent in warpage of the substrate, appearance, and the state of adhesion between the resin and the substrate, together with the storage stability of the uncured resin layer.

On the other hand, as shown in Table 2, Comparative Example 1 gave an uncured resin layer with tackiness to fail to give good handleability since the component (B) was not used. In Comparative Examples 5 to 8, without using the component (A), the uncured resin layer failed to attain flexibility, causing breakage of the sheet before laminating the sheet, and the uncured resin layer readily caused cracks and peeling from the substrate after being laminated. As shown in Table 2 and Table 4, Comparative Examples 2 and 3, using a curing accelerator other than urea-based one without using the component (E), gave an uncured resin layer that lacked storage stability and unfavorable filling properties. In Comparative Example 4 shown in Table 2 and Table 4, curing was not performed in a prescribed time since the component (E) was not used and the content of the curing accelerator other than urea-based one was small. In encapsulation using the composition for forming an uncured resin layer of Example 1 only, the substrate warped largely since the thermosetting epoxy resin-impregnated fiber base material was absent.

From the above, it was revealed that the inventive fiber-containing resin substrate makes it possible to collectively encapsulate a semiconductor devices mounting surface of the substrate having semiconductor devices mounted thereon or a semiconductor devices forming surface of the wafer having semiconductor devices formed thereon on a wafer level, even when a large-diameter wafer or a large-diameter substrate made of a metal and so on is encapsulated, to reduce warpage of the substrate or the wafer and peeling of a semiconductor device from the substrate, and to have the uncured resin layer excellent in storage stability and handleability before curing.

It should be noted that the present invention is not limited to the foregoing embodiments. The embodiments are just exemplification, and any examples that have substantially the same feature and demonstrate the same functions and effects as those in the technical concept described in claims of the present invention are included in the technical scope of the present invention.

What is claimed is:

1. A fiber-containing resin substrate for collectively encapsulating a semiconductor devices mounting surface of a substrate or a sheet on which two or more semiconductor devices are mounted or a semiconductor devices forming surface of a wafer on which semiconductor devices are formed, comprising:
   a thermosetting epoxy resin-impregnated fiber base material composed of a fiber base material impregnated with a thermosetting epoxy resin that is semi-cured or cured, and
   an uncured resin layer formed on one side of the thermosetting epoxy resin-impregnated fiber base material for coating the semiconductor devices mounting surface or the semiconductor devices forming surface,
   wherein the uncured resin layer is a layer formed from a composition containing:
   (A) a crystalline bisphenol A type epoxy resin and/or a crystalline bisphenol F type epoxy resin,
   (B) an epoxy resin that is non-fluid at 25° C. other than the component (A),
   (C) a phenol compound having two or more phenolic hydroxy groups in a molecule thereof,
   (D) an inorganic filler, and
   (E) an urea-based curing accelerator.

2. The fiber-containing resin substrate according to claim 1, wherein the component (A) is contained in an amount of 10 to 25 parts by mass relative to 100 parts by mass of the total amount of the components (A), (B), and (C); and the component (E) is contained in an amount of 0.05 to 6 parts by mass relative to 100 parts by mass of the total amount of the components (A), (B), and (C).

3. The fiber-containing resin substrate according to claim 1, wherein the component (D) is contained in an amount of 80 to 93 parts by mass relative to 100 parts by mass of the composition.

4. The fiber-containing resin substrate according to claim 2, wherein the component (D) is contained in an amount of 80 to 93 parts by mass relative to 100 parts by mass of the composition.

5. The fiber-containing resin substrate according to claim 1, wherein the component (E) is shown by the following general formula (1), $$R^1NHCONR^2R^3 \quad (1)$$

wherein $R^1$ represents a hydrogen atom, an alkyl group having 1 to 18 carbon atoms, or an aryl group having 6 to 18 carbon atoms; and $R^2$ and $R^3$ each represent an alkyl group having 1 to 6 carbon atoms; with $R^1$ to $R^3$ being the same different with each other.

6. The fiber-containing resin substrate according to claim 2, wherein the component (E) is shown by the following general formula (1), $$R^1NHCONR^2R^3 \quad (1)$$

wherein $R^1$ represents a hydrogen atom, an alkyl group having 1 to 18 carbon atoms, or an aryl group having 6 to 18 carbon atoms; and $R^2$ and $R^3$ each represent an alkyl group having 1 to 6 carbon atoms; with $R^1$ to $R^3$ being the same or different with each other.

7. An encapsulated semiconductor devices mounting substrate, comprising a semiconductor devices mounting surface of a substrate on which two or more semiconductor devices are mounted, the semiconductor devices mounting surface being collectively encapsulated with a cured material of the uncured resin layer of the fiber-containing resin substrate according to claim 1.

8. An encapsulated semiconductor devices mounting substrate, comprising a semiconductor devices mounting surface of a substrate on which two or more semiconductor devices are mounted, the semiconductor devices mounting surface being collectively encapsulated with a cured material of the uncured resin layer of the fiber-containing resin substrate according to claim 2.

9. An encapsulated semiconductor devices forming wafer, comprising a semiconductor devices forming surface of a wafer on which two or more semiconductor devices are formed, the semiconductor devices forming surface being collectively encapsulated with a cured material of the uncured resin layer of the fiber-containing resin substrate according to claim 1.

10. An encapsulated semiconductor devices forming wafer, comprising a semiconductor devices forming surface of a wafer on which two or more semiconductor devices are formed, the semiconductor devices forming surface being collectively encapsulated with a cured material of the uncured resin layer of the fiber-containing resin substrate according to claim 2.

11. An encapsulated semiconductor devices mounting sheet, comprising a semiconductor devices mounting surface of a sheet on which two or more semiconductor devices are mounted, the semiconductor devices mounting surface being collectively encapsulated with a cured material of the uncured resin layer of the fiber-containing resin substrate according to claim 1.

12. An encapsulated semiconductor devices mounting sheet, comprising a semiconductor devices mounting surface of a sheet on which two or more semiconductor devices are mounted, the semiconductor devices mounting surface being collectively encapsulated with a cured material of the uncured resin layer of the fiber-containing resin substrate according to claim 2.

13. A semiconductor equipment, wherein the encapsulated semiconductor devices mounting substrate according to claim 7 is diced into each piece.

14. A semiconductor equipment, wherein the encapsulated semiconductor devices mounting substrate according to claim 8 is diced into each piece.

15. A semiconductor equipment, wherein the encapsulated semiconductor devices forming wafer according to claim 9 is diced into each piece.

16. A semiconductor equipment, wherein the encapsulated semiconductor devices forming wafer according to claim 10 is diced into each piece.

17. A semiconductor equipment, wherein the encapsulated semiconductor devices mounting sheet according to claim 11 is diced into each piece.

18. A semiconductor equipment, wherein the encapsulated semiconductor devices mounting sheet according to claim 12 is diced into each piece.

19. A method for manufacturing a semiconductor equipment, comprising the steps of:

covering the semiconductor devices mounting surface of a substrate or a sheet on which two or more semiconductor devices are mounted or the semiconductor devices forming surface of a wafer on which two or more semiconductor devices are formed with the uncured resin layer of the fiber-containing resin substrate according to claim 1;

collectively encapsulating the semiconductor devices mounting surface or the semiconductor devices forming surface by heating and curing the uncured resin layer to form an encapsulated semiconductor devices mounting substrate, an encapsulated semiconductor devices forming wafer, or an encapsulated semiconductor devices mounting sheet; and dicing the encapsulated semiconductor devices mounting substrate, the encapsulated semiconductor devices forming wafer, or the encapsulated semiconductor devices mounting sheet into each piece to manufacture the semiconductor equipment.

20. A method for manufacturing a semiconductor equipment, comprising the steps of:

covering the semiconductor devices mounting surface of a substrate or a sheet on which two or more semiconductor devices are mounted or the semiconductor devices forming surface of a wafer on which two or more semiconductor devices are formed with the uncured resin layer of the fiber-containing resin substrate according to claim 2;

collectively encapsulating the semiconductor devices mounting surface or the semiconductor devices forming surface by heating and curing the uncured resin layer to form an encapsulated semiconductor devices mounting substrate, an encapsulated semiconductor devices forming wafer, or an encapsulated semiconductor devices mounting sheet; and dicing the encapsulated semiconductor devices mounting substrate, the encapsulated semiconductor devices forming wafer, or the encapsulated semiconductor devices mounting sheet into each piece to manufacture the semiconductor equipment.

* * * * *